(12) United States Patent
Ziegler

(10) Patent No.: US 9,224,666 B2
(45) Date of Patent: Dec. 29, 2015

(54) CIRCUIT ARRANGEMENT FOR A THERMALLY CONDUCTIVE CHIP ASSEMBLY AND A MANUFACTURING METHOD

(75) Inventor: Robert Ziegler, Traunstein (DE)

(73) Assignee: RHODE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 13/466,317

(22) Filed: May 8, 2012

(65) Prior Publication Data

US 2013/0277846 A1 Oct. 24, 2013

(30) Foreign Application Priority Data

Apr. 18, 2012 (DE) .......................... 10 2012 206 362

(51) Int. Cl.
*H01L 23/15* (2006.01)
*H01L 23/00* (2006.01)
(Continued)

(52) U.S. Cl.
CPC ............. *H01L 23/15* (2013.01); *H01L 23/3677* (2013.01); *H01L 24/27* (2013.01); *H01L 24/29* (2013.01); *H01L 24/32* (2013.01); *H01L 24/83* (2013.01); *H01L 23/34* (2013.01); *H01L 23/367* (2013.01); *H01L 23/3731* (2013.01); *H01L 23/49827* (2013.01); *H01L 24/48* (2013.01); *H01L 2224/27442* (2013.01); *H01L 2224/27505* (2013.01); *H01L 2224/2929* (2013.01); *H01L 2224/29339* (2013.01); *H01L 2224/32225* (2013.01); *H01L 2224/48091* (2013.01); *H01L 2224/48227* (2013.01); *H01L 2224/48237* (2013.01); *H01L 2224/73265* (2013.01); *H01L 2224/8385* (2013.01); *H01L 2224/83192* (2013.01); *H01L 2224/83439* (2013.01); *H01L 2224/83444* (2013.01);

(Continued)

(58) Field of Classification Search
CPC ................................ H01L 33/48; H01L 33/64
USPC ............................................ 257/717; 438/686
See application file for complete search history.

(56) References Cited

U.S. PATENT DOCUMENTS 4,554,573 A   11/1985 Yamamoto et al.
5,138,430 A    8/1992 Gow et al.
(Continued)

FOREIGN PATENT DOCUMENTS

DE        32 27 815 A1     2/1983
DE       101 20 928 C1    10/2002
(Continued)

OTHER PUBLICATIONS

German Search Report for corresponding German Application No. 10 2012 206 362.5, dated Feb. 28, 2013, 2 pages.
(Continued)

*Primary Examiner* — Colleen Matthews
*Assistant Examiner* — William Harriston
(74) *Attorney, Agent, or Firm* — Ditthavong & Steiner, P.C.

(57) ABSTRACT

The circuit arrangement according to the invention provides a substrate (10), a connecting element (18) and a chip (16). The substrate (10) provides at least a partial metallisation (11) on its surface. The connecting element (18) is applied to the metallisation (11). The chip (16) is applied to the connecting element (18). The connecting element (18) provides an electrically non-conductive glass layer (14), which is applied directly to the metallisation (11), and an adhesive layer (15) between the chip (16) and the glass layer (14).

15 Claims, 3 Drawing Sheets

(51) Int. Cl.
  *H01L 23/373* (2006.01)
  *H01L 23/34* (2006.01)
  *H01L 23/367* (2006.01)
  *H01L 23/498* (2006.01)

(52) U.S. Cl.
  CPC ........... *H01L 2224/83488* (2013.01); *H01L 2224/92247* (2013.01); *H01L 2924/00014* (2013.01); *H01L 2924/07802* (2013.01); *H01L 2924/15787* (2013.01)

(56) References Cited

U.S. PATENT DOCUMENTS

| | | | | |
|---|---|---|---|---|
| 6,132,543 | A | * | 10/2000 | Mohri et al. ............ 156/89.12 |
| 2009/0200572 | A1 | * | 8/2009 | Kamamori et al. .......... 257/100 |
| 2011/0140154 | A1 | * | 6/2011 | Nakayama et al. ............ 257/98 |
| 2012/0018759 | A1 | * | 1/2012 | Ohta ............................ 257/98 |
| 2012/0057364 | A1 | * | 3/2012 | Kishimoto et al. .......... 362/538 |

FOREIGN PATENT DOCUMENTS

| | | |
|---|---|---|
| DE | 102 06 818 A1 | 8/2003 |
| GB | 2 103 250 A | 2/1983 |
| JP | 63237535 A | 4/1988 |
| WO | 8908975 A1 | 9/1989 |

OTHER PUBLICATIONS

International Search Report for International Application No. PCT/EP2013/058094, dated Dec. 11, 2013, 7 pages.

M. F. Ashby, "Chapter 4: Material property charts ED", book, Jan. 1, 2005, pp. 44-78, Materials Selection in Mechanical Design, Amsterdam.

* cited by examiner

CIRCUIT ARRANGEMENT FOR A THERMALLY CONDUCTIVE CHIP ASSEMBLY AND A MANUFACTURING METHOD

The invention relates to an arrangement for assembling a chip on a substrate and a manufacturing method for the arrangement.

Conventionally, chips with integrated circuits are assembled on substrates by means of thermally and electrically conductive adhesives. This allows a favourable transfer of heat from the power converted in the integrated circuit into the substrate. For example, the German patent specification DE 101 20 928 C1 shows a chip assembly of this kind. However, in this context, it is disadvantageous that a high electrical conductivity is at the same time associated with a high thermal conductivity. This seriously restricts the design possibilities for the circuit on the chip. For instance, many applications do not allow an earth potential at the rear of the chip of the integrated circuit. It is therefore necessary to connect the chip to the substrate in an electrically insulating manner. However, conventional, electrically non-conductive adhesives provide a low thermal conductivity.

The invention is based upon the object of providing a circuit arrangement which provides an electrically non-conductive but thermally very highly conductive connection between a chip with an integrated circuit and a substrate. Furthermore, the invention is based upon the object of providing a corresponding manufacturing method.

The object is achieved according to the invention for the circuit arrangement by the features of the independent claim 1 and for the manufacturing method by the features of the independent claim 9. Advantageous further developments form the subject matter of the dependent claims referring back to these claims.

The circuit arrangement according to the invention provides a substrate, a connecting element and a chip. The substrate provides at least a partial metallisation on its surface. The connecting element is applied to the metallisation. The chip is applied to the connecting element. The connecting element provides an electrically non-conductive glass layer, which is preferably applied directly onto the metallisation, and an adhesive layer which can also be electrically conductive between the chip and the glass layer. Accordingly, an electrical insulation of the chip from the metallisation with simultaneous high thermal conductivity of the connection is achieved.

The adhesive layer advantageously provides a relatively greater specific thermal conductivity than the glass layer, preferably greater by at least the factor 5, by particular preference greater by at least the factor 10. In this manner, a particularly good thermal conductivity of the connection is achieved.

The specific thermal resistances and thicknesses of the adhesive layer and the glass layer are preferably such that a thermal resistance of the adhesive layer is less than the thermal resistance of the glass layer, preferably less by at least the factor 2, by particular preference less by at least the factor 5. This further increases the thermal conductivity of the connection.

The metallisation is preferably applied to the substrate by means of a thick-layer process. The metallisation then provides a maximum surface roughness of 5 μm, preferably a maximum of 2 μm, by particular preference a maximum of 1 μm. The glass layer then provides a maximum average thickness of 12 μm, preferably a maximum of 8 μm, by particular preference a maximum of 5 μm. In this manner, a very simple manufacture of the metallisation is possible.

As an alternative, the metallisation is applied to the substrate by means of a thin-layer process. The metallisation then provides a maximum surface roughness of 1 μm, preferably a maximum of 0.5 μm, by particular preference a maximum 0.25 μm. The glass layer accordingly provides a maximum average thickness of 5 μm, preferably a maximum of 3 μm, by particular preference a maximum of 1.5 μm. This allows a particularly low thickness of the glass layer. This results in a particularly high thermal conductivity of the connection.

The glass layer is preferably applied to the substrate by sintering a glass paste. This allows a very simple manufacture of the glass layer.

The adhesive layer preferably comprises a binding agent, preferably epoxy resin with incorporated metal particles, preferably silver particles. The adhesive layer is preferably electrically conductive. Readily available standard adhesives can therefore be used.

The metallisation preferably comprises gold or a silver-palladium alloy or a silver-platinum alloy. As an alternative, a copper metallisation can also be used. In this context, an additional surface coating can optionally be used. Accordingly, the circuit arrangement can be manufactured in a standardised process.

A method according to the invention for the manufacture of a circuit arrangement with a substrate, a connecting element and a chip provides the following steps:
  manufacture of at least a partial metallisation on the substrate,
  manufacture of a glass layer on the metallisation;
  application of an adhesive layer to the glass layer;
  application of the chip to the adhesive layer. This guarantees a simple and secure manufacture of the circuit arrangement.

The invention is described by way of example on the basis of the drawings in which the advantageous exemplary embodiments of the invention are presented. The drawings are as follows.

The general structure and method of functioning of an exemplary embodiment of the circuit arrangement according to the invention is first explained with reference to FIG. 1. Following this, details of the structure of different exemplary embodiments will be described with reference to FIGS. 2-3. Finally, the detailed method of functioning of an exemplary embodiment of the manufacturing method is explained in greater detail with reference to FIG. 4. The presentation and description of identical elements in similar drawings have not been repeated in some cases.

Figure 1:
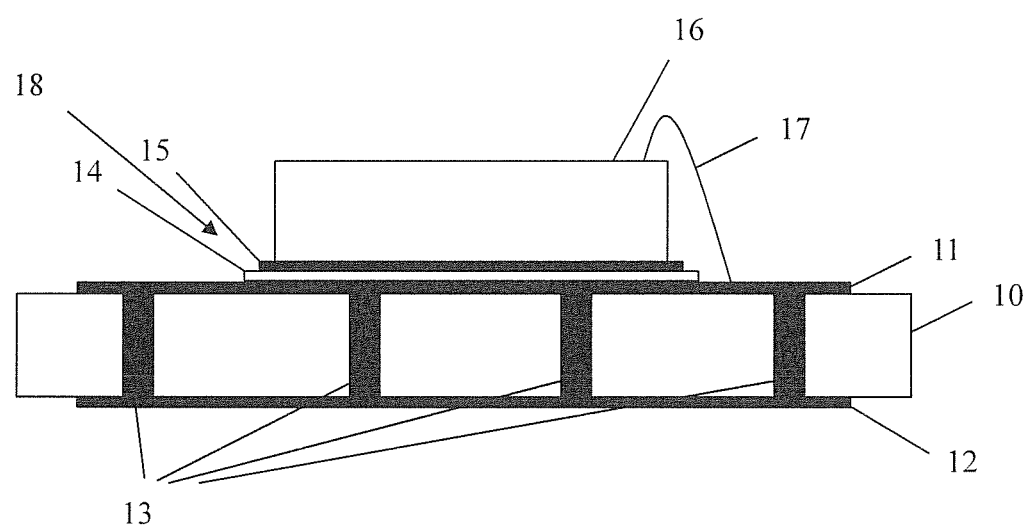
FIG. 1 shows a general exemplary embodiment of the circuit arrangement according to the invention in a lateral sectional view.

FIG. 1 shows in lateral section an overview of a general exemplary embodiment of the circuit arrangement according to the invention. A substrate 10, for example, a ceramic substrate, provides a metallisation 11 on its upper side and a metallisation 12 on its lower side. These metallisations 11 and 12 cover at least a part of each surface. Accordingly, the metallisations 11 and 12 are optionally connected to one another by means of through connections (VIAS) 13. These through connections 13 ensure an electrical contact of the metallisations 11 and 12 and additionally provide a very good thermal connection of the metallisations 11 and 12 to one another.

A glass layer 14 is applied to the upper side of the metallisation 11, which is applied to the upper side of the substrate 10. An adhesive layer 15 is applied to the glass layer 14. A chip 16, which contains an integrated circuit, is attached by means of the adhesive layer 15. The chip 16 is connected electrically via one or more lines 17 (bond wires) to the metallisation 11 or further circuit elements not illustrated here.

This glass layer 14 provides a thickness which gives it the properties of an electrical insulator. With regard to the thickness, reference is made to FIGS. 2 and 3. Glass provides a relatively low specific thermal conductivity. Accordingly, the thickness of the glass layer 14 is selected to be as thin as possible, in order not to increase the thermal resistance between the chip 16 and the metallisation 11 unnecessarily.

By contrast, the adhesive layer 15 provides a high thermal conductivity. This is preferably achieved in that good thermally conductive metal particles are bound in a carrier material. For example, silver particles are incorporated in an epoxy resin carrier. Such an adhesive also provides a high electrical conductivity. However, this is not problematic here, because the glass layer 14 ensures the insulation of the chip 16 from the metallisation 11.

The glass layer 14 and the adhesive layer 15 accordingly form a connecting element 18, which connects the chip 16 to the metallisation 11.

Figure 2:
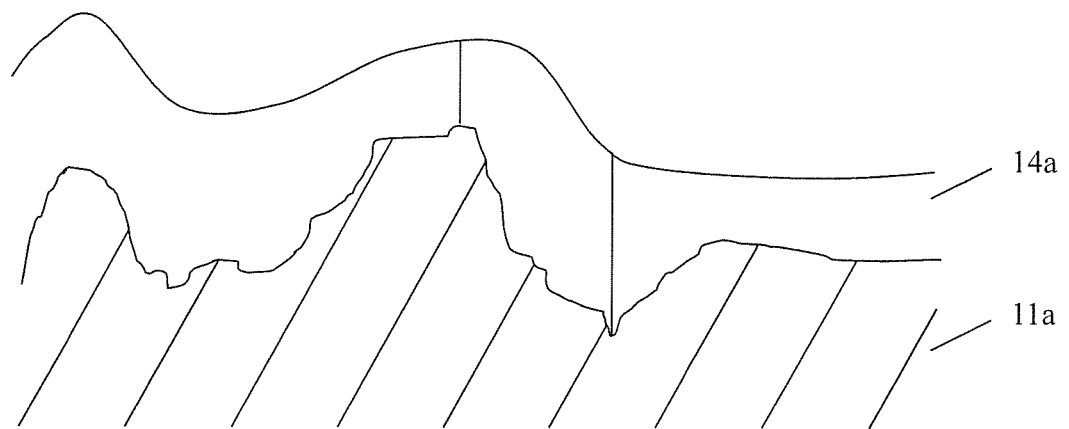
FIG. 2 shows a detail of a first exemplary embodiment of the circuit arrangement according to the invention in a lateral sectional view.

FIG. 2 shows a detail of a first exemplary embodiment of the circuit arrangement according to the invention. Only the considerably enlarged surface of the metallisation 11a, which corresponds to the metallisation 11 from FIG. 1, and the glass layer 14a, which corresponds to the glass layer 14 from FIG. 1, are shown here. The surface of the metallisation 11a here provides a high roughness. This high roughness is due to the manufacturing process of the metallisation. For example, a surface roughness as illustrated here could occur through the manufacture of the metallisation in a thick-layer process. A maximum surface roughness of 5 µm, preferably a maximum of 3 µm, by particular preference a maximum of 5 µm, can be realised using a thick-layer process. To avoid impairing the insulating properties of the glass layer 14a, a certain minimum thickness of the glass layer 14a is therefore necessary. In this context, the surface of the glass layer 14a is not completely flat but is adapted to the surface of the metal. However, it compensates the roughness to a certain extent. If the metallisation is manufactured by means of a thick-layer process, as illustrated here, a required maximum average thickness of the glass layer of 12 µm, preferably a maximum of 8 µm, by particular preference a maximum of 5 µm is provided, in order to cover even the maximum elevations in the surface reliably. Contact between the metallisation 11a and the lower side of the chip 16 must be avoided.

Figure 3:
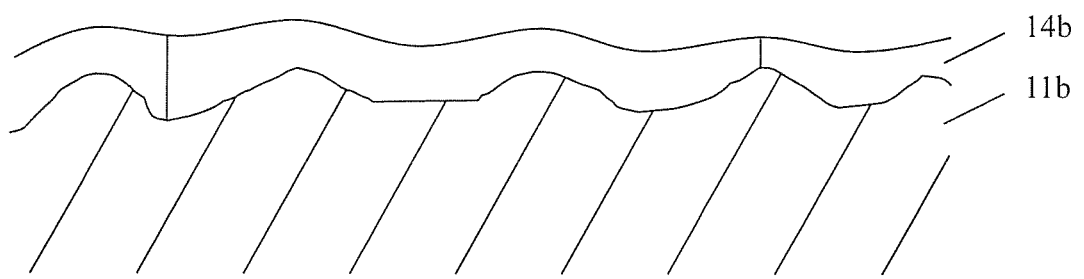
FIG. 3 shows a detail of a second exemplary embodiment of the circuit arrangement according to the invention in a lateral sectional view.

FIG. 3 shows a detail of a second exemplary embodiment of the circuit arrangement according to the invention in a considerably enlarged sectional view. Here also, only the surface of the metallisation 11b, which corresponds to the metallisation 11 from FIG. 1, and the glass layer 14b, which corresponds to the glass layer 14 from FIG. 1, are illustrated. In this context, the metallisation 11b provides a significantly reduced roughness. This is also due to the manufacturing process used here. Such a low surface roughness can be achieved by manufacturing the metallisation using a thin-layer process. Accordingly, a few atomic layers of the metallisation 11b are vaporised onto the substrate 10 by means of vacuum deposition (CVD), and then enlarged to a required target thickness by means of a galvanic process. This leads to a maximum surface roughness of 1 µm, preferably a maximum of 0.5 µm, by particular preference a maximum of 0.25 µm. In this context, only glass thicknesses of a maximum of 5 µm, preferably a maximum of 3 µm, by particular preference a maximum of 1.5 µm are necessary.

In all of the exemplary embodiments, gold, a silver-palladium alloy, a silver-platinum alloy or copper can be used for the metallisation. Other metallic materials are also conceivable for the metallisation. The solution according to the invention is significantly superior with regard to thermal conductivity by comparison with the use of an electrically non-conductive adhesive. For example, an electrically non-conductive adhesive provides a thermal resistance greater than the electrically conductive adhesive used by a factor of 10 to 20. Although the glass layer reduces the overall thermal conductivity of the connection between the chip and the substrate, the thermal conductivity is still significantly greater than with the use of an electrically non-conductive adhesive. The thermal resistances and the thickness of the adhesive layer and the glass layer are selected in this context in such a manner that a thermal resistance of the adhesive layer is less than the thermal resistance of the glass layer, preferably less by at least the factor 2, by particular preference less by at least the factor 5.

In this context, the glass layer 14 is applied to the metallisation 11 by sintering. The manufacturing method is described in greater detail with reference to FIG. 4.

Figure 4:
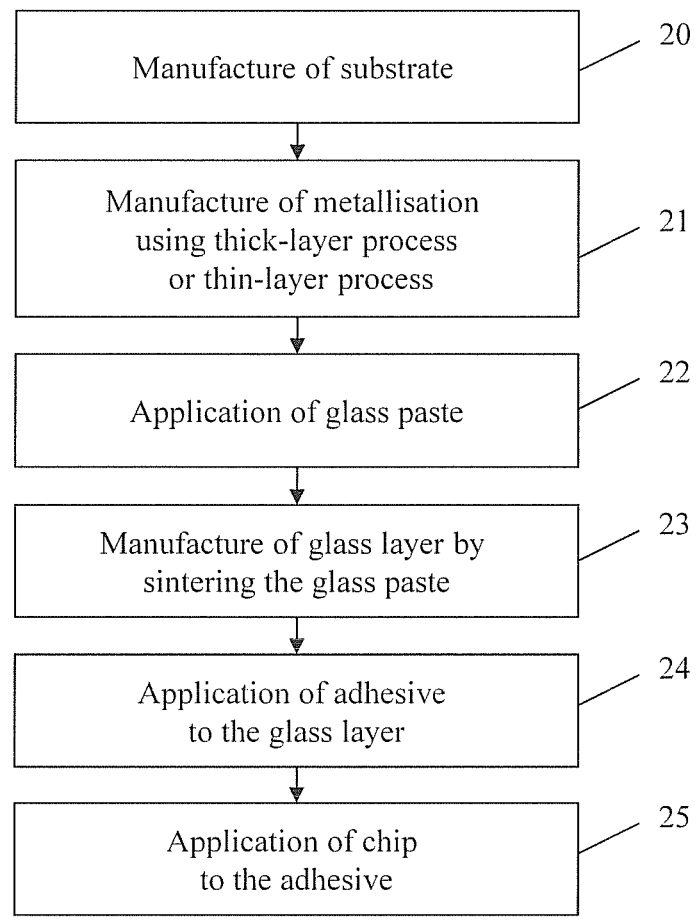
FIG. 4 shows a first exemplary embodiment of the manufacturing method according to the invention.

FIG. 4 shows an exemplary embodiment of the manufacturing method according to the invention. In a first step 20, a substrate, preferably a ceramic substrate is manufactured. In a second step 21, a metallisation of at least a part of the surface of the substrate is manufactured. This metallisation is manufactured using a thick-layer process or a thin-layer process. In the third step 22, a glass paste is applied in a certain thickness based on the roughness of the surface of the metallisation achieved in the second step 21. The lower the roughness of the surface of the metallisation from the second step 22, the more thinly the glass paste can be applied. With regard to the actual thicknesses required, reference is made to the explanations associated with FIG. 2 and FIG. 3.

In a fourth step 23, a glass layer is manufactured from the glass paste. This is achieved by sintering. That is, the carrier material of the glass paste is removed by the sintering process. The glass particles of the glass paste are bonded to one another. A continuous glass layer with a certain residual graininess is obtained. Part of this step is, of course, cooling after the sintering process.

In a fifth step 24, an adhesive is then applied to the glass layer. This is a good thermally conductive adhesive. By preference, it is an electrically conductive adhesive. In this context, the adhesive preferably comprises a binding agent and metallic particles. For example, 20% epoxy resin and 80% silver particles could be used.

In a sixth step 25, the chip with the integrated circuit is applied to the adhesive. In this context, it should be remembered that the entire surface of the chip to be connected should be covered by the adhesive. In particular, it should be remembered that the chip is disposed with its full surface over the glass layer manufactured. It should also be borne in mind that the chip does not contact the metallisation at any point. It must also be remembered that the electrically conductive adhesive does not contact the metallisation at any point.

After the hardening of the adhesive, the chip can optionally also be electrically connected to other circuit components by means of bond wires.

The invention is not restricted to the illustrated exemplary embodiment. For example, different materials can be used for the metallisation, the adhesive or for the manufacture of the glass layer. An assembly of several chips on one substrate is also conceivable. All of the features described above or shown in the drawings can be combined with one another advantageously as required within the scope of the invention.

The invention claimed is:

1. A circuit arrangement comprising:
a substrate, a connecting element and a chip,
wherein the substrate provides on its surface at least a partial metallization,
wherein the connecting element is applied to the metallization,
wherein the chip is applied to the connecting element,
wherein the connecting element provides an electrically non-conductive glass layer which is applied to the metallization,
wherein the glass layer extends completely between the chip and the substrate;
wherein an adhesive layer is applied between the chip and the glass layer,
wherein the metallization extends between the glass layer and the substrate so that the glass layer can be applied to the metallization,
wherein a through connection connects the metallization on an upper side of the substrate to a lower side of the substrate in an area of the connecting element,
wherein the glass layer is substantially adapted to a surface of the metallization, and a thickness of the glass layer is configured to electrically insulate the chip from the metallization while minimizing a thermal resistance between the chip and the metallization,
wherein the metallization is applied to the substrate by a thick-layer process,
wherein the metallization provides a maximum surface roughness in a range of 1 µm to 5 µm, and
wherein the glass layer provides a maximum average thickness in a range of 5 µm to 12 µm.

2. The circuit arrangement according to claim 1, wherein the adhesive layer provides a greater specific thermal conductivity than the glass layer by at least a factor of 5.

3. The circuit arrangement according to claim 1, wherein specific thermal resistances and thicknesses of the adhesive layer and of the glass layer are such that the thermal resistance of the adhesive layer is less than the thermal resistance of the glass layer by at least a factor of 2.

4. A circuit arrangement, comprising:
a substrate, a connecting element and a chip,
wherein the substrate provides on its surface at least a partial metallization,
wherein the connecting element is applied to the metallization,
wherein the chip is applied to the connecting element,
wherein the connecting element provides an electrically non-conductive glass layer which is applied to the metallization,
wherein the glass layer extends completely between the chip and the substrate;
wherein an adhesive layer is applied between the chip and the glass layer,
wherein the metallization extends between the glass layer and the substrate so that the glass layer can be applied to the metallization,
wherein a through connection connects the metallization on an upper side of the substrate to a lower side of the substrate in an area of the connecting element,
wherein the glass layer is substantially adapted to a surface of the metallization, and a thickness of the glass layer is configured to electrically insulate the chip from the metallization while minimizing a thermal resistance between the chip and the metallization,
wherein the metallization is applied to the substrate by a thin-layer process, and
wherein the metallization provides a maximum surface roughness in a range of 0.25 µm to 1 µm.

5. The circuit arrangement according to claim 1, wherein the glass layer is applied by sintering a glass paste onto the substrate.

6. The circuit arrangement according to claim 1, wherein the adhesive layer has a binding agent, the binding agent having an epoxy resin with incorporated metal particles, and wherein the adhesive layer is electrically conductive.

7. The circuit arrangement according to claim 1, wherein the metallization comprises gold or a silver-palladium alloy or a silver-platinum alloy or copper.

8. A method for manufacturing a circuit arrangement with a substrate, a connecting element and a chip, comprising:
providing at least a partial metallization on the substrate;
providing a glass layer on the metallization, wherein the glass layer extends completely between the chip and the substrate,
applying an adhesive layer to the glass layer,
applying the chip to the adhesive layer,
wherein the metallization extends between the glass layer and the substrate so that the glass layer can be applied to the metallization,
wherein a through connection connects the metallization on an upper side of the substrate to a lower side of the substrate in an area of the connecting element,
wherein the glass layer is substantially adapted to a surface of the metallization, and a thickness of the glass layer is configured to electrically insulate the chip from the metallization while minimizing a thermal resistance between the chip and the metallization,
wherein the metallization is applied to the substrate by a thick-layer process,
wherein the thick-layer process achieves a maximum surface roughness of the metallization in a range of 1 µm to 5 µm, and
wherein the glass layer is applied in such a manner that is provides a maximum average thickness in a range of 5 µm to 12 µm.

9. The method according to claim 8, wherein the adhesive layer is applied in such a manner that it provides a greater specific thermal conductivity than the glass layer by at least a factor of 5.

10. The method according to claim 8, wherein the specific thermal resistances and thicknesses of the adhesive layer and of the glass layer are selected in such a manner that the thermal resistance of the adhesive layer is less than the thermal resistance of the glass layer by at least a factor 2.

11. A method for manufacturing a circuit arrangement with a substrate, a connecting element and a chip, comprising:
providing at least a partial metallization on the substrate,
providing a glass layer on the metallization, wherein the glass layer extends completely between the chip and the substrate,
applying an adhesive layer to the glass layer,
applying the chip to the adhesive layer, wherein the metallization extends between the glass layer and the substrate so that the glass layer can be applied to the metallization, wherein a through connection connects the metallization on an upper side of the substrate to a lower side of the substrate in an area of the connecting element, wherein the glass layer is substantially adapted to a surface of the metallization, and a thickness of the glass layer is configured to electrically insulate the chip from the metallization while minimizing a thermal resistance between the chip and the metallization, wherein the metallization is applied to the substrate by a thin-layer process, and wherein the thin-layer process achieves a maximum surface roughness of the metallization in a range of 0.25 μm to 1 μm.

12. The method according to claim 8, wherein the glass layer is applied to the substrate by sintering a glass paste.

13. The method according to claim 8, wherein the adhesive layer is manufactured from a binding agent, the binding agent including an epoxy resin with incorporated metal particles, so that the adhesive layer is electrically conductive.

14. The method according to claim 8, wherein the metallization is manufactured from gold or a silver-palladium alloy or a silver-platinum alloy or copper.

15. The method according to claim 13, wherein the metal particles comprise silver particles.

* * * * *

UNITED STATES PATENT AND TRADEMARK OFFICE
CERTIFICATE OF CORRECTION

PATENT NO. : 9,224,666 B2  Page 1 of 1
APPLICATION NO. : 13/466317
DATED : December 29, 2015
INVENTOR(S) : Robert Ziegler It is certified that error appears in the above-identified patent and that said Letters Patent is hereby corrected as shown below:

On the Title page, item (73), the Assignee's information which reads:

"RHODE & SCHWARZ GMBH & CO. KG, Munich (DE)" should read:

"ROHDE & SCHWARZ GMBH & CO. KG, Munich (DE)"

Signed and Sealed this
Seventh Day of June, 2016

Michelle K. Lee
*Director of the United States Patent and Trademark Office*